US010103284B2

(12) United States Patent
Lange et al.

(10) Patent No.: US 10,103,284 B2
(45) Date of Patent: Oct. 16, 2018

(54) APPARATUS FOR THE INDUSTRIAL PRODUCTION OF PHOTOVOLTAIC CONCENTRATOR MODULES

(71) Applicant: Saint-Augustin Canada Electric Inc., Saint-Augustin de Desmaures (CA)

(72) Inventors: Gerrit Lange, Vorstetten (DE); Karl Friedrich Haarburger, Merzhausen (DE); Eckart Gerster, Freiburg (DE)

(73) Assignee: Saint-Augustin Canada Electric Inc., Saint-Augustin de Desmaures (CA)

( * ) Notice: Subject to any disclaimer, the term of this patent is extended or adjusted under 35 U.S.C. 154(b) by 1115 days.

(21) Appl. No.: 14/361,265

(22) PCT Filed: Dec. 7, 2012

(86) PCT No.: PCT/EP2012/005070
§ 371 (c)(1),
(2) Date: May 28, 2014

(87) PCT Pub. No.: WO2013/083284
PCT Pub. Date: Jun. 13, 2013

(65) Prior Publication Data
US 2014/0331472 A1    Nov. 13, 2014

(30) Foreign Application Priority Data

Dec. 8, 2011   (DE) .................... 20 2011 108 836 U
Dec. 23, 2011  (DE) .................... 20 2011 109 424 U (51) Int. Cl.
*H01L 31/052*   (2014.01)
*H01L 31/05*    (2014.01)
(Continued)

(52) U.S. Cl.
CPC ........ *H01L 31/0524* (2013.01); *H01L 31/044* (2014.12); *H01L 31/048* (2013.01);
(Continued)

(58) Field of Classification Search
CPC ... H01L 31/054; H01L 31/0543; H01L 31/18; H01L 31/0524; H01L 31/188
(Continued)

(56) References Cited

U.S. PATENT DOCUMENTS

| 4,258,698 A | 3/1981 | Sales |
| 4,834,805 A | 5/1989 | Erbert |

(Continued)

FOREIGN PATENT DOCUMENTS

| DE | 102006007472 A1 | 8/2007 |
| WO | 2007134536 A1 | 11/2007 |
| WO | 2010124078 A2 | 10/2010 |

OTHER PUBLICATIONS

International Search Report for International Application No. PCT/EP2012/005070 dated Mar. 26, 2013, 3 pages.
(Continued)

*Primary Examiner* — Philip C Tucker
*Assistant Examiner* — John A Blades
(74) *Attorney, Agent, or Firm* — TraskBritt (57) ABSTRACT

Apparatus for the industrial production of photovoltaic concentrator modules, consisting of a module frame, a lens disc, a sensor carrier disc and an electrical line routing arrangement, comprising the following features: a) a mount for the stress-free mounting of a module frame by means of clamping elements on both longitudinal sides and stop elements on both transverse sides, wherein the setting of the clamping elements takes place by means of the displacement and rotation of a switching rod, b) a device for a punctiform application of acrylic and a linear application of silicone onto the bearing surfaces of the module frame, c) a respective device for placing the sensor carrier disc or the lens disc, wherein these discs are transported in a stress-free fashion by means of special suction apparatuses and are emplaced (Continued)

with a centrally starting, predetermined contact pressure, d) a device for measuring the respective disc position and for positioning a sensor carrier disc or a lens disc, e) a device for the fine adjustment of the lens disc with respect to the CPV sensors of the sensor carrier disc by means of a camera, wherein the camera is adjusted in such a way that the position of its optical axis impinges on the geometrical midpoint of a CPV sensor, f) a device for curing the silicone application between the module frame and the respective disc by means of a plurality of UV light emitters, and g) devices for transporting the workpieces to be processed.

12 Claims, 10 Drawing Sheets

(51) Int. Cl.
*H01L 31/054* (2014.01)
*H01L 31/18* (2006.01)
*H01L 31/044* (2014.01)
*H01L 31/048* (2014.01)

(52) U.S. Cl.
CPC ........ *H01L 31/052* (2013.01); *H01L 31/0504* (2013.01); *H01L 31/0543* (2014.12); *H01L 31/188* (2013.01); *Y02E 10/52* (2013.01); *Y10T 29/49826* (2015.01)

(58) Field of Classification Search
USPC .......................................................... 156/64
See application file for complete search history.

(56) References Cited

U.S. PATENT DOCUMENTS

| | | |
|---|---|---|
| 9,190,554 B2 | 11/2015 | Schmid et al. |
| 9,640,696 B2 | 5/2017 | Gerster |
| 9,680,441 B2 | 6/2017 | Iizuka et al. |
| 2010/0175685 A1 | 7/2010 | Campbell et al. |
| 2011/0014725 A1* | 1/2011 | Abiko .................. H01L 31/048 438/4 |

OTHER PUBLICATIONS

Chinese First Office Action for Chinese Application No. 201280060414.2, dated Oct. 27, 2015, 8 pages.
Chinese First Search for Chinese Application No. 201280060414.2, dated Oct. 16, 2015, 2 pages.
Chinese Second Office Action for Chinese Application No. 201280060414.2, dated Jun. 20, 2016, 7 pages.
International Written Opinion for International Application No. PCT/EP2012/005070 dated Mar. 26, 2013, 3 pages.

* cited by examiner

APPARATUS FOR THE INDUSTRIAL PRODUCTION OF PHOTOVOLTAIC CONCENTRATOR MODULES

CROSS-REFERENCE TO RELATED APPLICATIONS

This application is a national phase entry under 35 U.S.C. § 371 of International Patent Application PCT/EP2012/005070, filed Dec. 7, 2012, designating the United States of America and published in English as International Patent Publication WO 2013/083284 A1 on Jun. 13, 2013, which claims the benefit under Article 8 of the Patent Cooperation Treaty and under 35 U.S.C. § 119(e) to German Patent Application Serial No. 20 2011 109 424.7, filed Dec. 23, 2011, and to German Patent Application Serial No. 20 2011 108 836.0, filed Dec. 8, 2011, the disclosure of each of which is hereby incorporated herein in its entirety by this reference.

TECHNICAL FIELD

The industrial production of photovoltaic concentrator modules consisting of a module frame, a lens disc, a sensor carrier disc and an electrical line routing arrangement.

BACKGROUND

In photovoltaics, for many years there have already been approaches for working with concentrated solar radiation. In this case, the radiation from the sun is concentrated by means of mirrors and/or lenses, and directed onto specific concentrator solar cells. Corresponding systems of concentrating photovoltaics (CPV) are currently being tested in the Spanish Solar Research Institute (Instituto de Sistemas Fotovoltaicos de Concentracion (ISFOC)) in Castile at Puertollano. They concentrate the sunlight using lenses or mirrors to four hundred- to thousand-fold intensity before it impinges on small solar cells, which are significantly more efficient than traditional silicon solar cells. Manufacturers from many parts of the world have installed CPV modules on the test site there. Approximately a thousand modules are currently installed on the site. Researchers are developing return prognoses, inter alia, and testing long-term stability in order to facilitate the transition from development to the markets for this technology.

Globally only a small number of CPV installations have been in operation hitherto. Their total power of approximately 30 megawatts corresponds approximately to the power of three nuclear power stations. A recent study by the American Market Research Institute Greentechmedia Research predicts, however, that this technology will advance apace. Accordingly, the CPV power installed annually might be 1000 megawatts as early as in 2015. Under favorable conditions, one kilowatt-hour of electrical energy from CPV installations, according to a study by the Fraunhofer Institute for solar energy systems (ISE) in Freiburg, costs between 18 and 21 cents per kilowatt-hour. Further cost reductions through more efficient components and mature industrial production are firmly expected.

At the heart of the installations are the high-power solar cells, which at present are in use primarily in space, where for years they have already been supplying satellites and robots with power. Instead of silicon, these cells contain so-called compound semiconductors composed of gallium, indium, arsenic or phosphorus. They consist of a plurality of different semiconductor layers, each of which processes a different range of the sunlight spectrum, while traditional silicon cells can convert only a smaller portion of the sunlight spectrum into electrical power. The following prior art is cited from the patent literature.

U.S. Pat. No. 4,834,805 discloses a photovoltaic power module comprising the following features.

An arrangement of photovoltaic semiconductor crystal cells, distributed in individual cell locations in a layered substrate, wherein they are enclosed by two electrically conductive layers and separated by means of an insulating layer. Furthermore, this module consists of a light-conveying layer composed of lenses, which is arranged at a distance from the layered substrate, wherein incident radiation is focused into the substrate in the light-conveying layer by means of the lens, and wherein the thickness of the lens layer, of the substrate layer and of the space therebetween is less than 2 inches.

DE 10 2006 007 472 A1 discloses a photovoltaic concentrator module comprising a lens plate and a baseplate, on which solar cells are accommodated, and a frame, wherein the frame, connecting the lens plate and the baseplate, is arranged circumferentially along the edge of the lens plate and the baseplate.

This known concentrator module is intended to be improved to the effect that it can be produced cost-effectively, has a long service life, and that it allows simple and flexible integration of additional components that cannot be accommodated, or can be accommodated only with difficulty, on the lens plate or the baseplate. Furthermore, the intention is to develop a method that makes it possible to produce such concentrator modules.

The problem stated here is solved by virtue of the fact that along the frame between the lens plate and the frame and/or the baseplate and the frame, first, at least one first sealing compound and/or adhesive compound and, second, at least one second sealing compound are arranged circumferentially, at least on part of the length of the frame, wherein the two sealing and/or adhesive compounds differ with regard to their curing time and/or gas permeability.

Claim 57 claims a method for producing a photovoltaic concentrator module according to any of the preceding claims, which is characterized by the following features.

Namely, that a frame connecting a lens plate and a baseplate is arranged along the edge of the lens plate and the baseplate, and that between the frame and the lens plate and/or the frame and the baseplate, first, at least one first sealing compound and/or adhesive compound and, second, at least one second sealing compound are introduced circumferentially along the frame over at least part of its length, wherein the two sealing and/or adhesive compounds differ with regard to their curing times and/or gas permeabilities. Although mention is made here of a first sealing compound and/or adhesive compound and a second sealing compound, the fact that one of the adhesive compounds serves only for fixing a plate during the production process by means of UV light, while another adhesive compound having a long service life is used for main sealing, cannot be inferred here.

Disclosure

The apparatus according to the invention and the corresponding method address the problem of presenting an apparatus and a method with which concentrator modules can be produced industrially inexpensively and reliably.

This problem is solved by means of an apparatus according to claim 1.

BRIEF DESCRIPTION OF THE DRAWINGS

The apparatus according to the invention is described in greater detail below. In this case, in detail.

DETAILED DESCRIPTION

Figure 1:
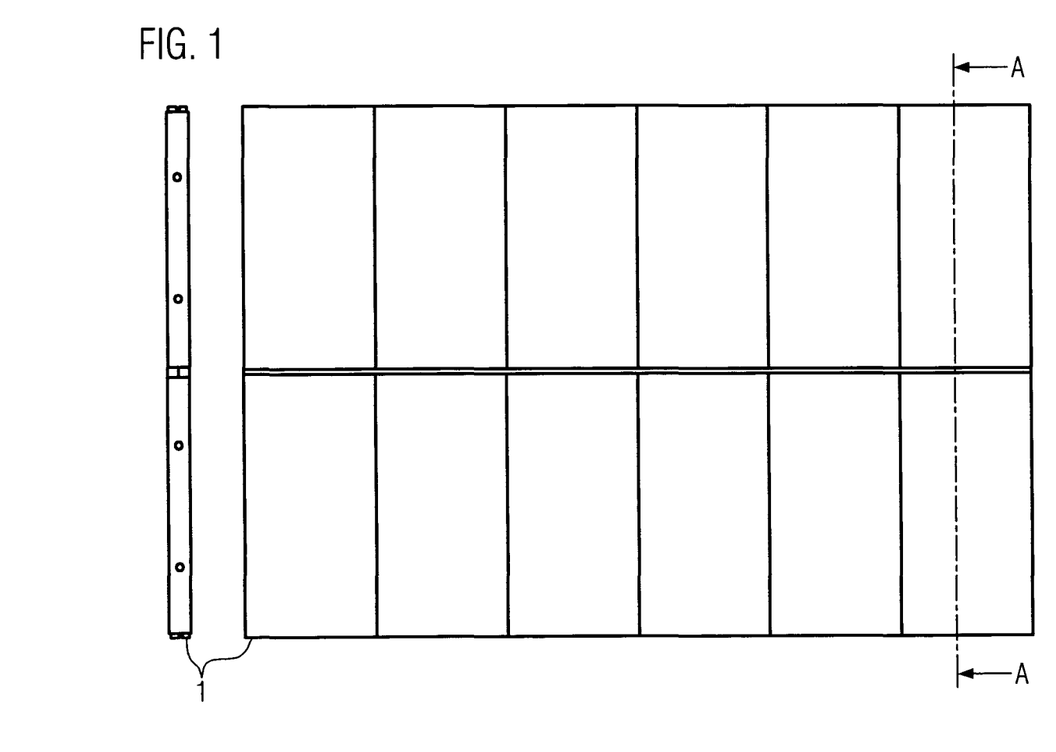
FIG. 1 shows a module frame 1 in plan view.

FIG. 1 shows a module frame (1) in plan view. The section A-A illustrates the viewing direction of the side view that can be seen in FIG. 2. The module frame is subdivided into the zones shown by means of transverse webs.

Figure 2:
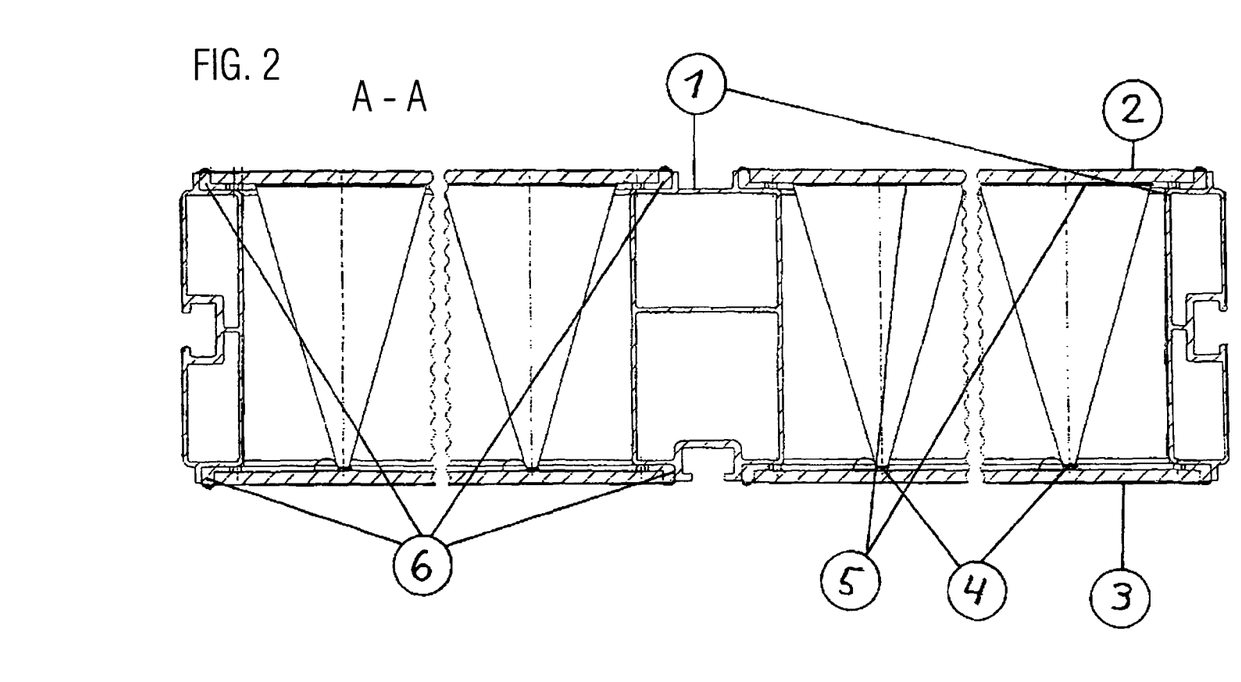
FIG. 2 shows a concentrator module in cross-section.

FIG. 2 shows a concentrator module with its carrying module frame (1) in cross-section in an enlarged illustration. Here, it is respectively possible to discern a lens disc 2 on the top side and a corresponding sensor carrier disc 3 as base disc on the underside. In this case, the module frame 1 is illustrated in a manner interrupted in its transverse extent on each side, in order to be able to show the details shown in the true size relationships. In the lens disc 2, indications of the Fresnel lenses 5 used are found on the right-hand side, and in the sensor carrier disc 3 there are the corresponding CPV sensors 4. In FIG. 2, the regions of the application of a silicone seal 6 are also clearly marked on the left-hand side.

Figure 3:
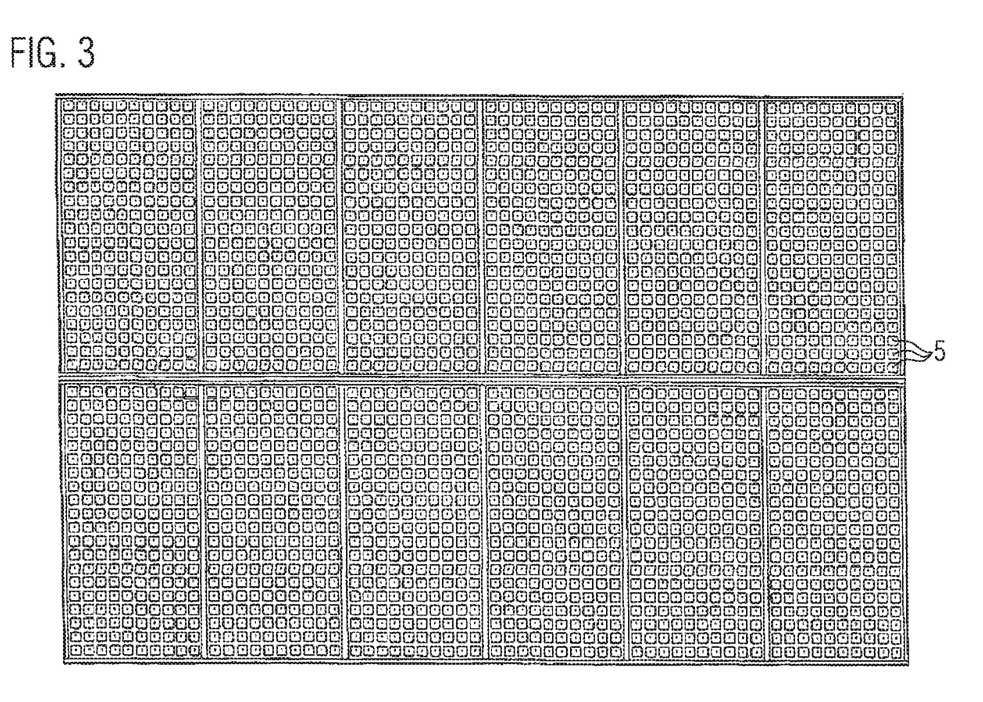
FIG. 3 shows a lens disc having Fresnel lenses 5.

FIG. 3 shows a lens disc with all Fresnel lenses 5 incorporated in this size of a module frame 1. Three of the Fresnel lenses 5 are designated separately on the right-hand side. On the left-hand side, in the circles depicted, the illustration shows the connections of the ribbon cables that combine the entire current of the individual CPV sensors 4 of each of the zones shown, and that are relayed in the center along a module frame 1.

Figure 4:
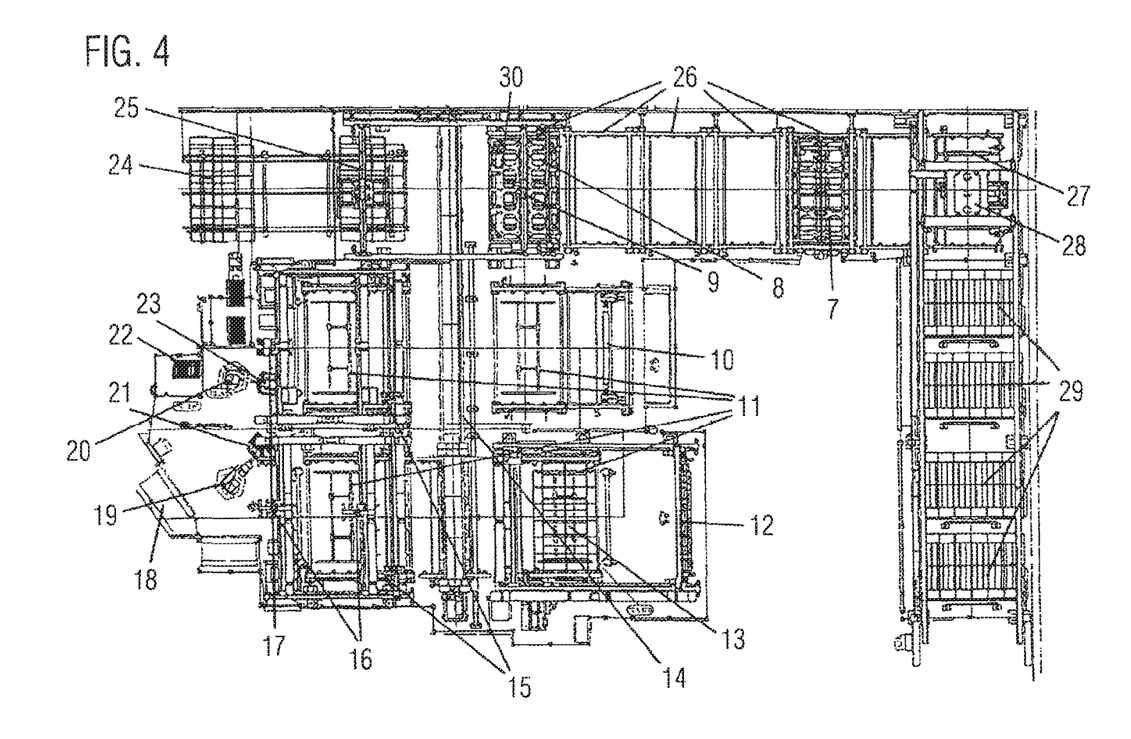
FIG. 4 shows an overview of a manufacturing installation according to the invention.

FIG. 4 offers an overview of a manufacturing installation for the industrial production of photovoltaic concentrator modules.

A magazine 24 for module frames 1 can be discerned at the top left corner of FIG. 4. Adjacent thereto, a gantry repositioning device for module frames 1 is furthermore designated by 25. The gantry repositioning device 25 accepts module frames 1 from the magazine 24 and passes them onto a placement device 9. A lifting table 8 with 5 planes is used in this case. This placement device 9 then places a respective module frame 1 onto a mount 30, which are moved together on the transverse conveyor 14 to the apparatus 15 for applying acrylic 46 and silicone 6. Here, acrylic spots and a corresponding silicone bead are applied to the respective top side of a module frame 1.

A sensor carrier disc 3 as baseplate is emplaced thereon. The magazine 18 for sensor carrier discs 3, the transfer robot 19 for sensor carrier discs 3 and the placement device 16 for sensor carrier discs 3 participate in this process. The sensor carrier disc 3 is pressed with a predetermined contact pressure by means of the device 16, starting centrally on the respective disc, and then fixed to the module frame 1 by the curing of the acrylic spots by means of UV light. Such a fixing cannot be inferred from the prior art. The corresponding production processes will be explained in greater detail later.

The mount 30 with the module carrier 1 equipped in this way is moved to the location for mechanical, or else—depending on the development stage—automatic, contact-making 13, where the module frame 1 is removed from the mount 30, rotated from the horizontal position into a vertical position, and conveyed for manual contact-making at the station 12. A distribution box for the electrical connecting lines is essentially incorporated here. The following electrical connection of the CPV sensors to the distribution box can be effected manually or automatically. Afterward, the module frame 1 is rotated into a horizontal position again, such that the sensor carrier disc 3 is at the bottom, and is fixed on a mount 30.

The mount 30 with the module carrier 1 equipped in this way is then moved to the apparatus 15 for applying acrylic 46 and silicone 6. Acrylic spots and a corresponding silicone bead are applied here.

A lens disc 2 is emplaced thereon. The magazine for lens discs 22, the transfer robot 20 for lens discs and the placement device 17 for lens discs participate in this process. The corresponding production processes will be explained in greater detail later. The individual processing stations are equipped with lifting tables 11. The lifting tables 11 serve for frictionlessly transporting mounts 30 and module carriers 1 during the operating sequence and enable components to be temporarily shifted into an intermediate storage location.

An exact alignment of the Fresnel lenses 5 with the corresponding CPV sensors 4 is necessary for a completely satisfactory function of the concentrator module. The lens discs 2 are adjusted by means of a camera (49). The technical process in this respect will be explained later.

Figure 6:
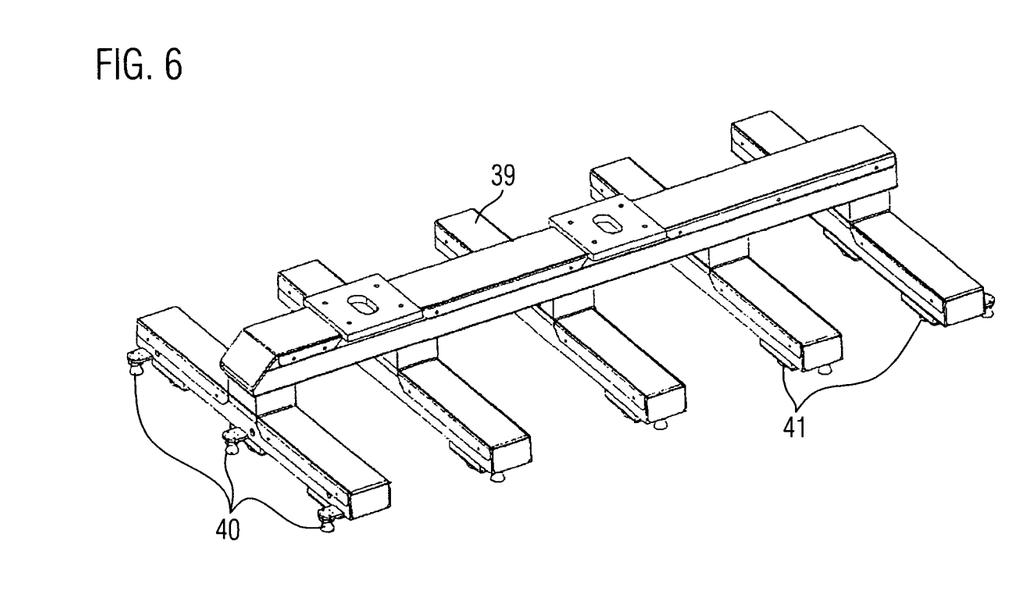
FIG. 6 shows an illustration of a placement device.

After the fine adjustment of a lens disc 2, the lens disc 2 is fixed by means of the curing of the acrylic spots by irradiation using a UV light emitter 40 (cf. FIG. 6). The mount 30 is then moved to the station 10, where it is brought to a vertical position. The excess silicone is then removed manually or automatically from the vertically oriented mount 30.

From the station 10, the mount 30 treated in this way is moved by means of the transverse conveyor 14 to a quality inspection.

After the quality inspection, the corresponding mount 30 is moved into the storage station 26, which has places in a plurality of planes, a plane for empty pallets also being provided. Here, the silicone has the necessary time to be able to cure.

After the curing time, each concentrator module is provided with a barcode and brought by means of a lifting table 27 and a gantry repositioning device 28 to stacking stations 29, which allow classification according to quality levels.

Figure 5:
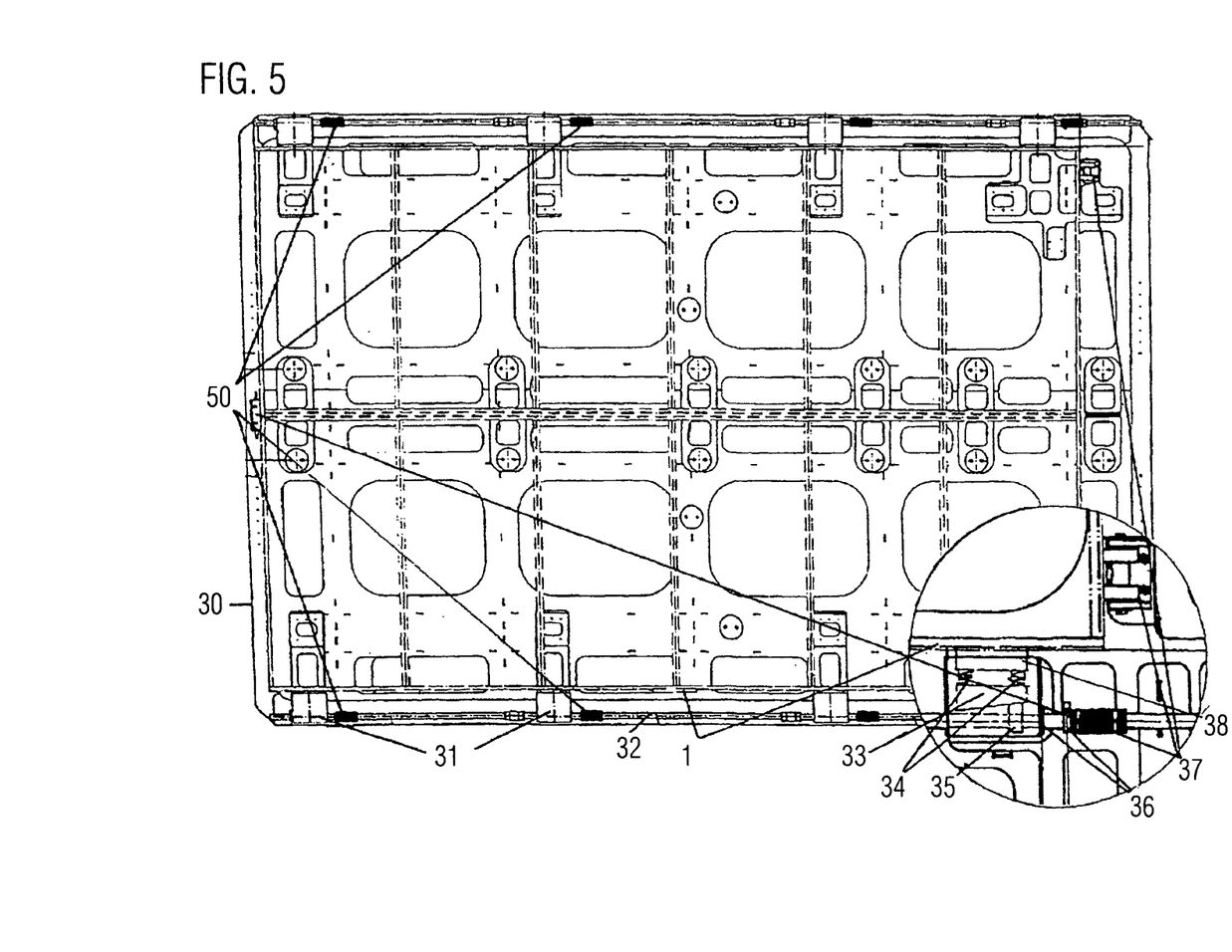
FIG. 5 shows a plan view of a mount 30.

FIG. 5 shows a plan view of a mount 30. The dashed lines identify here an emplaced module frame 1. In this case, the module frame 1 is fixed on the upper longitudinal side by means of the same clamping elements 31 as those designated in detail at the lower longitudinal side. A clamping bar 37 is provided on the left broad side in the center, at the location of the reinforced central web of the module frame 1, the clamping bar 37 corresponding to the two clamping bars 37 designated on the right broad side. These clamping bars have a conically beveled sliding surface enabling accurately fitting insertion and easy removal of a module frame 1 from above by means of a gripper. The functional principle of a clamping device can be discerned, by way of example, in the detailed illustration depicted in an enlarged view in a circle. The upper half of the circle shows the bottom right corner of the module frame 1 in an enlarged view. The clamping element 31, which is likewise in an enlarged view and is of approximately square design, reveals a switching rod 32 common to all four clamping elements 31 on this side. The operative principle realized here will be explained in greater detail below.

An eccentric disc 35 is seated on the switching rod 32 and engages on a beveled spline 33, which is, in turn, connected via two compression springs 34 to a stop element 37, which presses onto the module frame 1. If the switching rod 32 is displaced, in this case toward the left, the eccentric disc 35 is also displaced toward the left and, in a manner sliding along the spline 33, compresses the compression springs 34, which transmit this pressure elastically to the module frame 1. The two magnets 36 join together and thus fix this basic setting, for example.

This basic setting can be performed manually or in an automated manner.

For an automated displacement of the switching rod 32, many possibilities are known to the person skilled in the art and so they will not be described in greater detail.

A further adjustment possibility for this arrangement, illustrated in principle, consists in rotating the switching rod 32 and thus performing an additional setting, in particular, a fine setting, by means of the rotation of the eccentric disc 35.

This can also be performed manually or in an automated manner.

For the purpose of an automated setting, by means of the servomotor 50 illustrated, on the right-hand side of a clamping element 31, the switching rod 32 can be rotated, in addition to the displacement described, at the designated location. The sleeve shown on the other side of a clamping element 31 serves for the production engineering assembly of the switching rod 32. Such servomotors 50 are situated on each clamping element 31 in this case. This adjustment option makes it possible, in addition to a specific basic setting, whether it then be performed manually or in an automated manner, to set the contact pressure of each clamping element 31 individually in an automated manner. By means of corresponding distance sensors and corresponding pressure sensors, which are not shown and designated here for reasons of clarity in FIG. 5, the same individual contact pressure can thus be set at each location of the longitudinal side of a module frame 1 by means of the clamping elements 31. The same clamping elements 31 with the apparatuses described are incorporated on the other longitudinal side. This measure has the effect that even very slight deformations of the side walls of a module frame 1 can be automatically taken into account during the clamping, and so a totally stress-free mounting of a module frame 1 is ensured, and a lens disc 2 and a sensor carrier disc 3 can, therefore, in each case be combined with a module frame 1 in a manner totally free of stress. This measure ensures that the forces that act on the adhesive bond of these discs in the event of large temperature differences can be minimized. This results in very little loading on the adhesive bond of a concentrator module and in an increase in its service life even under difficult climatic requirements.

FIG. 6 shows an illustration of a placement device, having in each case five sucker carriers 39, as part of a transfer process by means of a transfer robot 19 for sensor carrier discs 3, or by means of a transfer robot 20 for lens discs 2.

In this case, a transfer robot generally has four sucker carriers on one side, by means of which carriers it picks up a respective disc on one side and transfers it to a placement device. A placement device generally has five sucker carriers 39. The transfer of a disc by means of a transfer robot is effected by a procedure in which the disc is held on one side by means of four sucker carriers, and is inserted by the transfer robot into the four interspaces of a sucker carrier of a transfer unit having five sucker carriers 39, and it is then sucked up on both sides by the transfer unit. The sucker carriers 39 in each case carry suckers 41 and UV light emitters 40 at their two ends, wherein UV light emitters 40 are also fitted in each case in the center of a sucker carrier 39.

Figure 7:
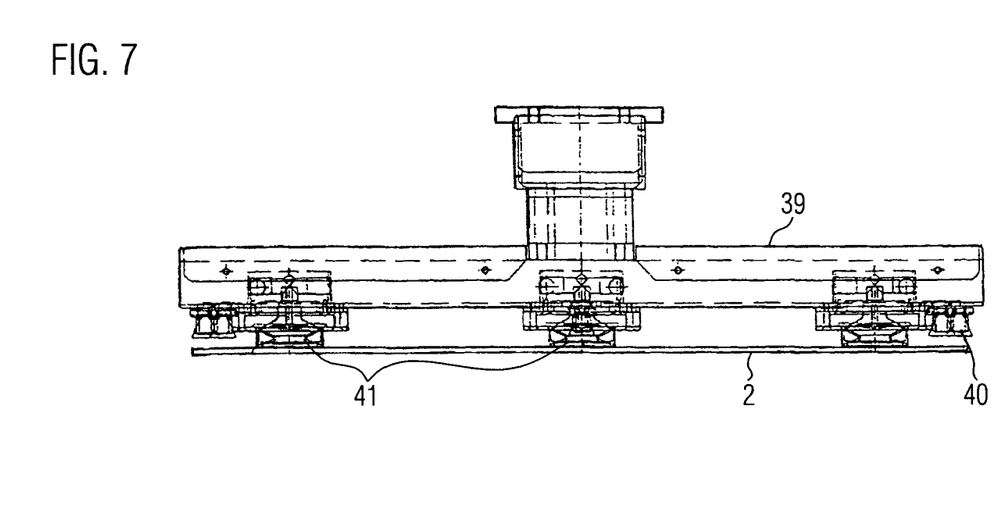
FIG. 7 shows a cross-section of a sucker carrier 39.

FIG. 7 shows a cross-section of a sucker carrier 39. In addition to the illustration in FIG. 6, a lens disc 2 that has been picked up is shown here. The two UV light emitters 40 on the left and right can be discerned here in cross-section. The central UV light emitters 40 are concealed.

Figure 8:
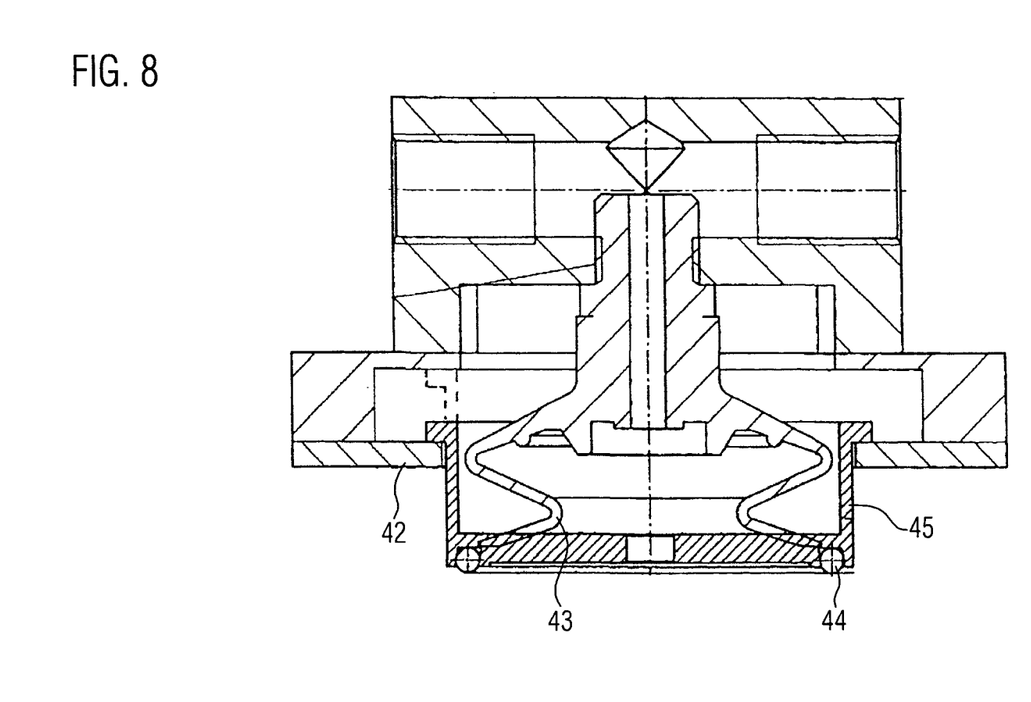
FIG. 8 shows a cross-section of a sucker 41.

FIG. 8 shows a cross-section of a sucker 41. The specific action of this sucker can be discerned in this illustration. Since, in the case of the discs to be picked up, primarily in the case of the sensor carrier out discs 3, it is important that they be transported and applied absolutely in a flat position. In the case of each sucker head, the area by which the respective disc is touched by the respective sucker head must be absolutely flat as well. This is achieved by virtue of the fact that, in the illustration shown, the sealing ring 44 is in a sucker head 45 composed of solid material. In this case, the sucker head 45 slides together with the rubber bellows 43 in the holding plate 42. Undulatory warpage of the picked-up disc at the locations of the engagement points of the respective suckers, as should be feared in other embodiments in the prior art with a flexible sealing lip, is ruled out in this case. The sucker head 45 can, in this case, for example, also be approximately square or have any other surface shape that induces as little mechanical stress as possible in the disc respectively picked up. Thus, for example, in this context, an elliptically shaped surface can contribute to reducing the stresses during picking-up and transport in the respective disc.

Figure 9:
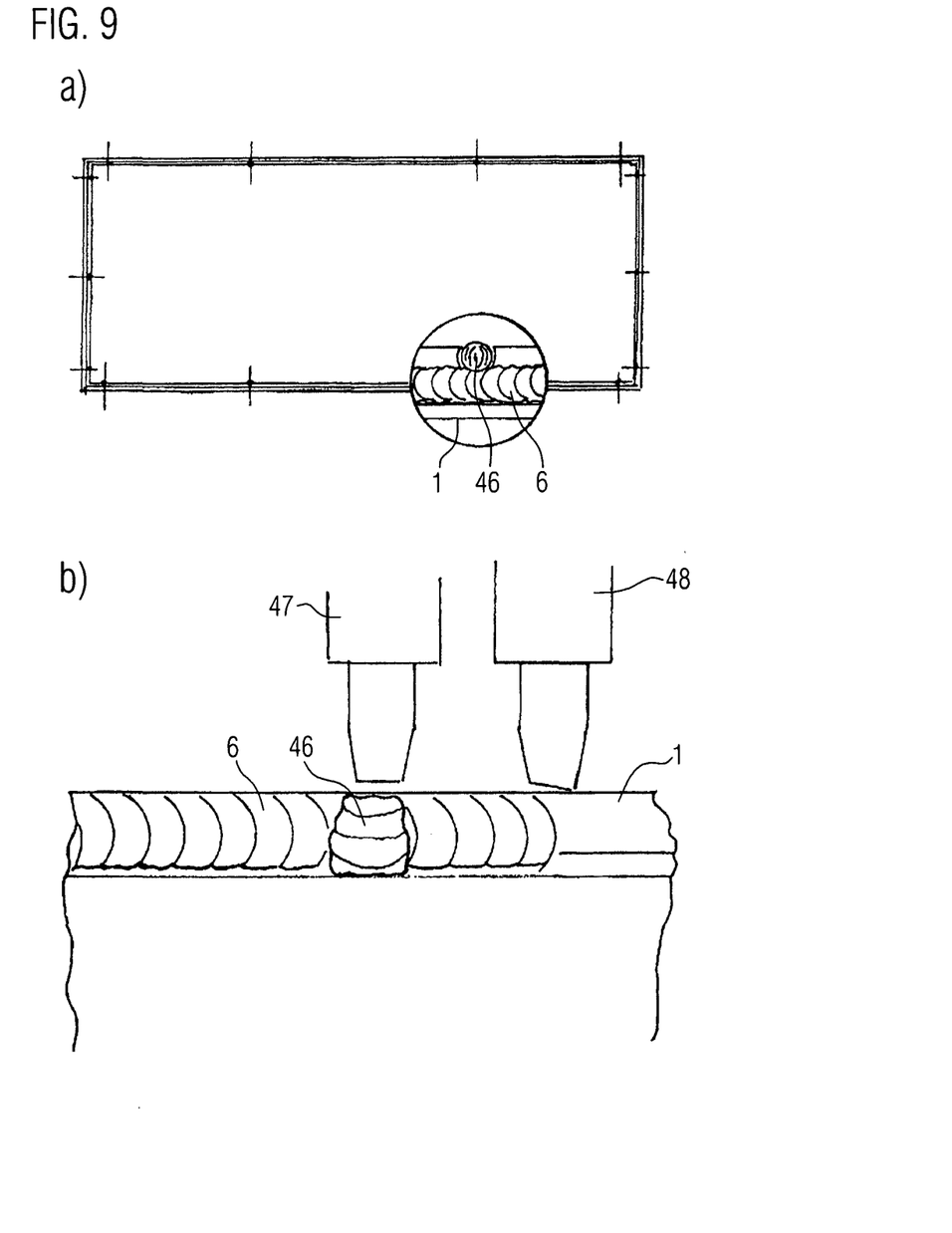
FIG. 9 shows an explanatory illustration of an adhesive-bonding process.

FIG. 9 offers an explanatory illustration of an adhesive-bonding process. In panel a), a detailed view of the circumferential edge of a module frame 1 can be seen, which is a circular detailed view at one location. Here, the edge of a module frame 1 and the adjacent application of a silicone bead 6 can be discerned in detail. An acrylic spot 46 can be seen closely alongside the silicone seal 6.

FIG. 9, panel b), additionally shows an acrylic application device 47 and a silicone application device 48 in a side view.

Figure 10:
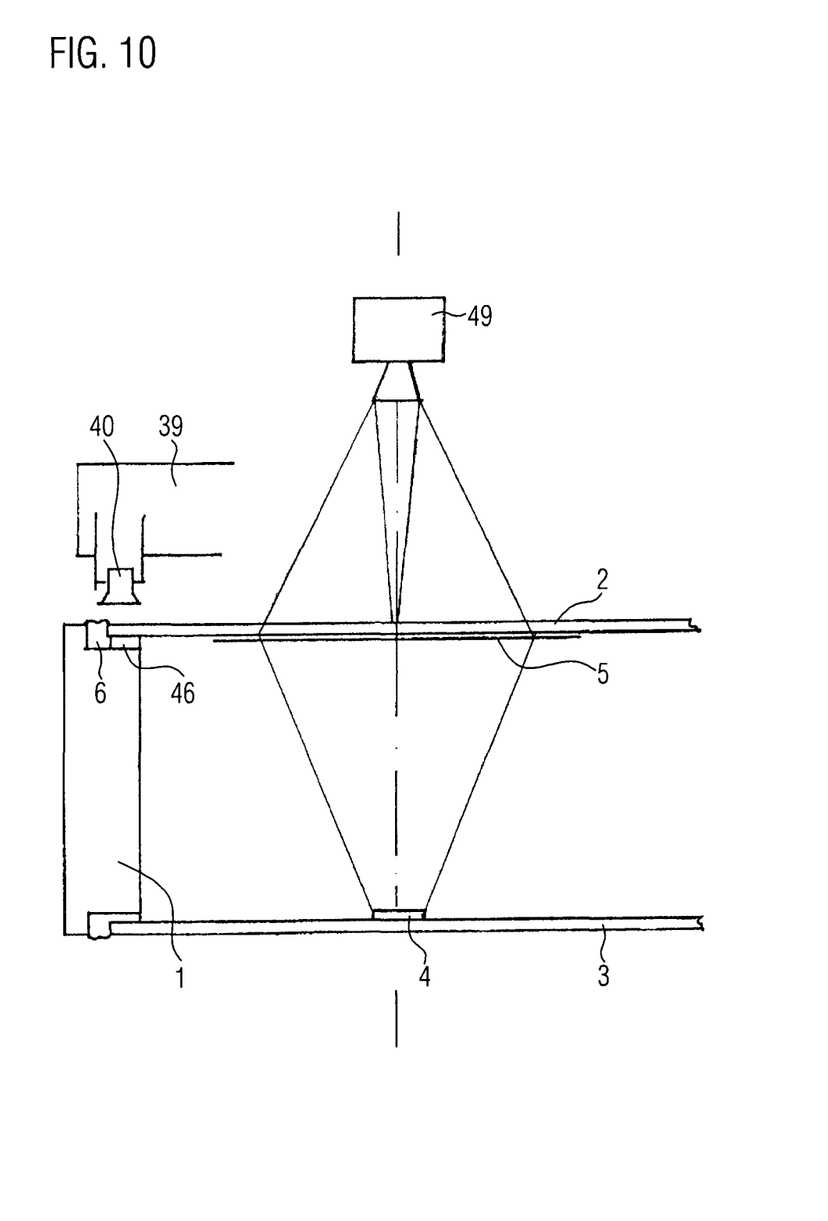
FIG. 10 shows an explanatory illustration of the fixing of a sensor carrier disc.

FIG. 10 offers an explanatory illustration of the fixing of a sensor carrier disc 3. Besides part of the cross-section of a module frame 1, a sensor carrier disc 3 and a lens disc 2, here, an acrylic spot 46 and the silicone seal 6 are shown. A sucker carrier 39 and a UV light emitter 40 are illustrated in a stylized manner on the left-hand side. By means of a camera 49, the lens disc 2 is aligned, and then fixed by means of the curing of corresponding acrylic spots 46, such that the midpoints of all the Fresnel lenses 5 are directed exactly at the center of the corresponding CPV sensors.

This alignment can be effected purely optically by the lens disc 2 being adjusted in such a way that the position of the optical axis of its Fresnel lenses 5 impinges on the geometrical midpoint of corresponding CPV sensors 4.

However, this alignment can also be effected in some other way, namely, such that voltage is applied to selected CPV sensors themselves, whereupon the light emitted by them via the Fresnel lenses is detected and the lens disc 2 is adjusted in such a way that the emission of particular strategically important Fresnel lenses 5 becomes a maximum. A device for detecting the respective disc position of a lens disc 2 relative to the position of the sensor carrier disc 3 and for detecting the positioning mechanisms is necessary for this purpose. Such devices are familiar to the person skilled in the art and, therefore, not illustrated. The control signals of such a device are used for driving the transfer robot 19 for sensor carrier discs 3.

The control of the complex movement processes and the signal processing of the sensors used require a specific control program.

LIST OF REFERENCE SIGNS

1 Module frame
2 Lens disc
3 Sensor carrier disc (baseplate)
4 CPV sensors
5 Fresnel lenses
6 Silicone seal
7 Test station for seal testing, labeling
8 Front lifting table for the mount (five planes) cf. reference numeral 27
9 Placement device for module frames (on mount)
10 Station for post-processing (silicone removal)
11 Lifting tables of the processing stations (two planes)
12 Station for manual contact-making (processing)
13 Station for mechanical, automatic contact-making
14 Transverse conveying device for mounts
15 Apparatus for applying acrylic and silicone
16 Placement device for a sensor carrier disc 3
17 Placement device for the lens disc 2
18 Magazine for sensor carrier discs
19 Transfer robot for sensor carrier discs
20 Transfer robot for lens discs
21 Suction gripper for sensor carrier discs (robot transfer)
22 Magazine for lens discs
23 Suction gripper for lens discs (robot transfer)
24 Magazine for module frames
25 Gantry repositioning device for module frames
26 Storage stations (four planes)
27 Rear lifting table for mounts (five planes) cf. reference numeral 8
28 Gantry repositioning device for final stacking (four stations)
29 Stacking stations (four quality levels)
30 Mount as carrier for module frame 1
31 Clamping element
32 Switching rod
33 Spline
34 Compression spring
35 Eccentric disc
36 Magnet
37 Stop element
38 Clamping bar
39 Sucker carrier
40 UV light emitter
41 Sucker
42 Holding plate
43 Rubber bellows
44 Sealing ring
45 Sucker head
46 Acrylic
47 Acrylic application device
48 Silicone application device
49 Camera
50 Servomotor

The invention claimed is:

1. A method for fixing a lens disc including Fresnel lenses of a photovoltaic concentrator module including a sensor carrier disc having CPV sensors and the lens disc sandwiching a module frame, the method comprising the steps of:
   a) aligning the lens disc with the sensor carrier disc using a camera; and
   b) fixing the lens disc on the module frame using at least one UV light emitter to cure acrylic spots;
   wherein the method further comprises, before aligning the lens disc with the sensor carrier disc and fixing the lens disc on the module frame, the following steps:
   c) placing the module frame onto a mount and moving the module frame and the mount together to an apparatus for applying acrylic and silicone and applying the acrylic spots and a corresponding silicone bead to the respective top side of the module frame, then
   d) placing a sensor carrier disc on the module frame, pressing the sensor carrier disc with a predetermined contact pressure, starting centrally, and then fixing the sensor carrier disc to the module frame by the curing of the acrylic spots by means of the at least one UV light emitter, then
   e) rotating the module frame into a horizontal position such that the sensor carrier disc is at the bottom, then
   f) applying the acrylic and the silicone on the module frame, and then
   g) placing the lens disc thereon.

2. The method of claim 1, wherein the lens disc is aligned with the sensor carrier disc such that midpoints of the Fresnel lenses are respectively directed at the centers of the corresponding concentrating photovoltaic (CPV) sensors.

3. The method of claim 1, further comprising applying the acrylic spots and silicone bead on the module frame before aligning the lens disc with the sensor carrier disc.

4. The method of claim 3, further comprising applying the acrylic spots and the silicone bead using a single apparatus.

5. The method of claim 4, further comprising applying fourteen acrylic spots per lens disc.

6. The method of claim 1, further comprising mounting twelve sensor carrier discs on one module frame.

7. The method of claim 1, wherein aligning the lens disc with the sensor carrier disc comprises purely optically aligning the lens disc with the sensor carrier disc by adjusting a relative position between the lens disc and the sensor carrier disc such that a position of an optical axis of each of the Fresnel lenses of the lens disc impinges on a geometrical midpoint of a corresponding CPV sensor of the sensor carrier disc.

8. The method of claim 1, wherein the at least one UV light emitter comprises a plurality of UV light emitters incorporated in a placement device, and further comprising using the placement device for placing the lens disc on the module frame and aligning the lens disc with the sensor carrier disc.

9. The method of claim 8, wherein each of steps a), b), and g) are realized one after the other using the placement device and the plurality of UV light emitters.

10. The method of claim 9, further comprising, between steps d) and e),
   moving the mount with the module frame to a location for mechanical or automatic making of electrical contacts.

11. The method of claim 8, further comprising applying the acrylic spots and silicone bead on the module frame before aligning the lens disc with the sensor carrier disc.

12. The method of claim 11, further comprising applying the acrylic spots and the silicone bead using a single apparatus.

\* \* \* \* \*